Jan. 9, 1968 H. E. DIJKMEIJER ET AL 3,363,146

BASE CONSTRUCTION FOR EVACUATED ENVELOPE HOUSING A PRINTED CIRCUIT AND COMPONENTS

Filed July 23, 1964 3 Sheets-Sheet 1

INVENTORS
HENRICUS E. DIJKMEIJER,
MARTINUS H. KUIJPERS,
BART VEENEMANS
BY

AGENT

INVENTORS
HENRICUS E. DIJKMEIJER,
MARTINUS H. KUIJPERS,
BART VEENEMANS
BY
Frank R. Trifari
AGENT INVENTORS
HENRICUS E. DIJKMEIJER,
MARTINUS H. KUIJPERS,
BART VEENEMANS
BY
Frank R. Trifari
AGENT United States Patent Office 3,363,146

Patented Jan. 9, 1968

3,363,146
BASE CONSTRUCTION FOR EVACUATED ENVELOPE HOUSING A PRINTED CIRCUIT AND COMPONENTS

Henricus Emanuel Dijkmeijer, Nijmegen, Martinus Henricus Kuijpers, Emmasingel, Eindhoven, and Bart Veenemans, Nijmegen, Netherlands, assignors to North American Philips Company, Inc., New York, N.Y., a corporation of Delaware Filed July 23, 1964, Ser. No. 384,689
Claims priority, application Netherlands, Aug. 13, 1963, 296,629
2 Claims. (Cl. 317—101)

ABSTRACT OF THE DISCLOSURE

An improved base construction and assembly for an evacuated electronic component. A printed circuit carrier, a plurality of conductors, a ring and a layer of glass are fabricated as an integral assembly. Additional printed circuit carriers overlie the first printed circuit carrier and are supported by the conductors. A close toleranced and minimal sized component results from the construction.

The invention relates to an evacuated envelope within which a printed circuit and component parts are housed and, in particular, to the base construction thereof through which a plurality of conductors are passed to the exterior of the envelope from the printed circuit within the closed, evacuated and hermetically sealed envelope.

A prior art construction is shown in the accompanying drawings, FIGS. 1 and 2.

In the prior art construction illustrated the base has a plurality of insulated conductors which are connected to the ceramic carrier provided a small distance above the base. The space which has to be maintained between the base and the printed circuit carrier is wasted space. Also, in this construction the orientation of the base apertures and the apertures in the circuit carrier have to be aligned with one another which requires very accurate assembly and hence costly manufacture. If provision for accurate alignment is not made, large tolerances must be permitted which involves other disadvantages. An object of the invention is to avoid the disadvantages.

According to the invention, the base wall of the envelope is formed, at least in part, by the ceramic carrier and a glass layer which is connected thereto, the printed circuit of the carrier being adjacent the interior of the envelope and the glass layer being present on the outer side of the envelope. The plurality of conductors pass through apertures in the carrier and are sealed into the glass layer in a vacuum tight manner.

It is to be noted that the term "ceramic carrier with printed circuit" is to be regarded in a broad sense and intended herein to include a ceramic carrier having one or more conductive layers which may form in themselves one or more circuit elements such as inductances, resistances, or capacitances, or which may serve for the fixation, for example, by soldering, and the electric interconnection of individual circiut elements such as the above mentioned and also, for example, transistors or diodes or photocells or crystal circuits.

The term "ceramic carrier" is used herein as a collective name for any insulating carrier for printed circuits having so high a melting point as to permit a glass layer to be fused to it without undergoing any troublesome deformation.

The above and other features, objects and advantages of the present invention will be fully understood from the following description considered in connection with the accompanying illustrative drawings.

Figure 1:
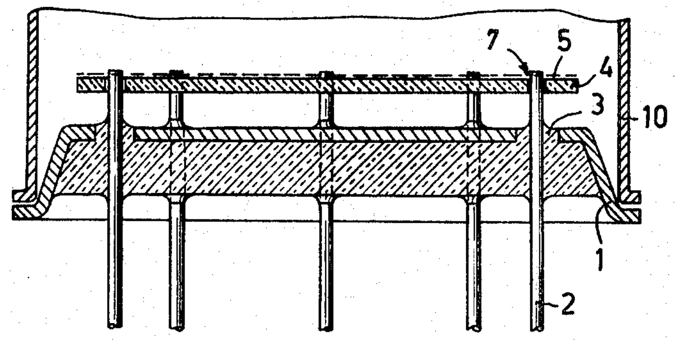
PRIOR ART FIG. 1
FIGURE 1 is a vertical sectional view of the base of a known electric structural element and FIGURE 2 is a plan view on this base.
Figure 2:
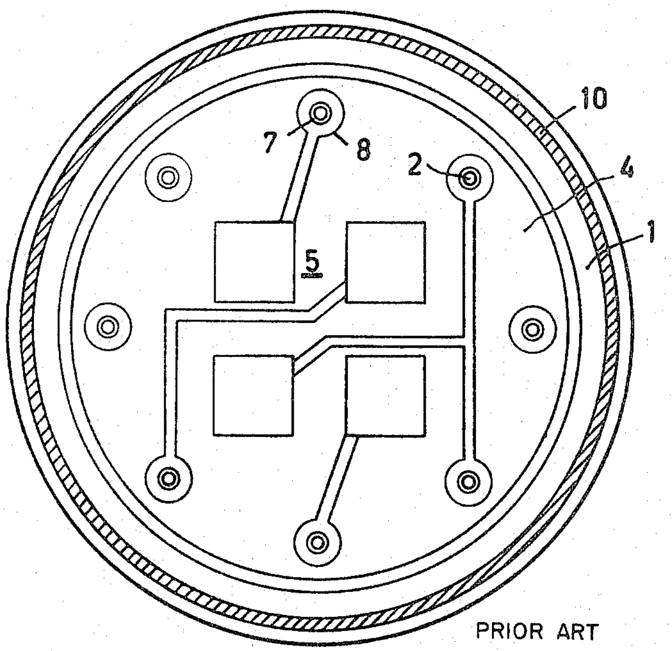

The known base structure shown in FIGURES 1 and 2 comprises a base 1, which may be made, for example, from fernico, a known alloy of iron, nickel and cobalt, in which eight conductors 2 are fixed by means of glass seals 3 and also insulated from the base 1 thereby. The conductors project slightly above the base and support a ceramic carrier 4 having a printed circuit 5 which is shown diagrammatically by a broken line. The manner in which the printed circuit is provided form no part of the present invention and will not be described further.

In the known construction, it is necessary to make allowance for the fact that the position of the conductors 2 in the base 1 and seals 3 may exhibit comparatively great tolerances so that apertures 7 in the ceramic plate 4 will have to be enlarged accordingly. This involves difficulties in establishing electrical connections between the conductors and portions 8 of the printed circuit which surround the apertures 7. In view of the glass of the seals 3 which extends through the base 1, it is necessary to position the ceramic carrier 4 at a certain distance from the base 1, which results in a loss of space and the dissipation of heat is impeded.

For the sake of completeness, it is to be noted that the assembly may be closed by a cap 10 which is shown in part in FIGURE 1.

Figure 3:
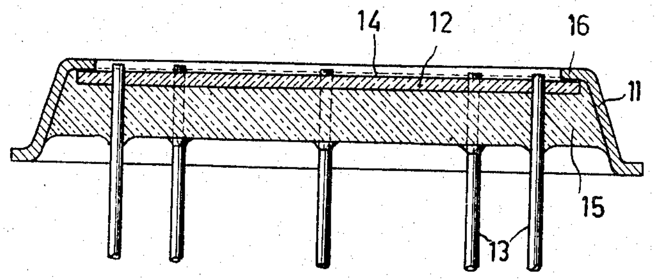
FIGURES 3 to 6 show vertical sections of several embodiments of bases of structural elements according to the invention.

The embodiment of the base of a structural element according to the invention as shown in FIGURE 3, comprises an open ring 11 which is, for example, of iron or fernico and which houses a ceramic carrier 12 into which a plurality of conductors 13 are inserted. A printed circuit 14 is provided, as before, on the side of the carrier 12 which is adjacent the interior of the envelope whereas the side adjacent to the exterior is covered with a glass layer 15 which unites the ring 11, the carrier 12 and the conductors 13 to form one vacuum tight base assembly. In this construction, the apertures in the carrier 12 through which the conductors 13 are passed need be no larger than the diameter of the conductors. Considering the fact that such a ceramic carrier may be manufactured with extreme accuracy this means that the complete base structure may also be very accurately manufactured. In the construction shown in FIGURE 3, the upper edge of the carrier 12 is juxtaposed by an inwardly directed wall or skirt 16 of the ring 12 so that the printed circuit cannot extend out to the edge of the carrier.

Figure 4:
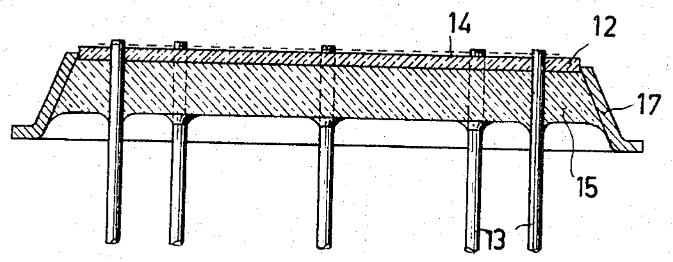

In the embodiment shown in FIGURE 4, the whole of the upper surface of the carrier 12 is free due to the use of a ring 17, the edge 16 of which is omitted.

As a result of the extreme accuracy with which the mutual position of the carrier 12 relative to the conductors 13 is determined, it is possible to accurately orientate two or more of such carriers with respect to one another.

Figure 5:
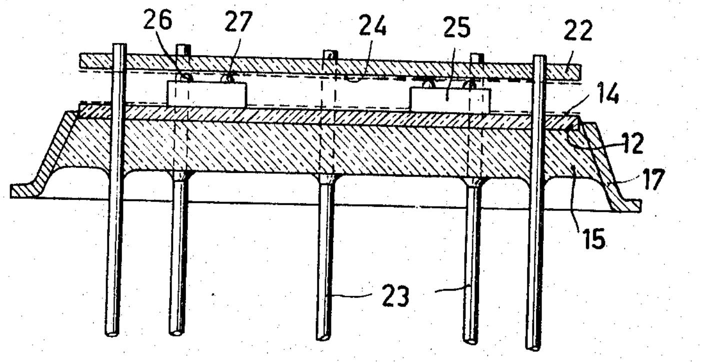

FIGURE 5 shows an embodiment which is substantially identical with that of FIGURE 3 or 4, but in which conductors 23 are passed through a second carrier 22. The carrier 22 is likewise provided with a printed circuit 24 on the side adjacent the carrier 12. It may serve, for example, for the connetcion of the wires 23 to portions of circuit elements fixed on the carrier 12. By way of example, two transistors 25 are shown on the carrier 12, having emitter contacts 26 and base contacts 27 which make contact with the printed circuit 24. As an alternative, the said circuit elements could have contacts in the form of thin layers, while projecting portions for contact making could be provided on the printed circuit 24. The conductors 13 or 23 and the printed circuits 14 or 24 may be connected together in a simple manner and a large number of base assemblies made simultaneously by applying, by electro deposition, a coating which is grown on the printed circuit and the conductors. In view of the accurate fitting of the conductors in the circuit carriers a comparatively thin coating will be sufficient to ensure satisfactory contact.

Since on sealing in the ceramic carrier the conductors are sealed in simultaneously, it is in general possible to provide them with heads which partly cover the printed circuit so that satisfactory contact is ensured.

Figure 6:
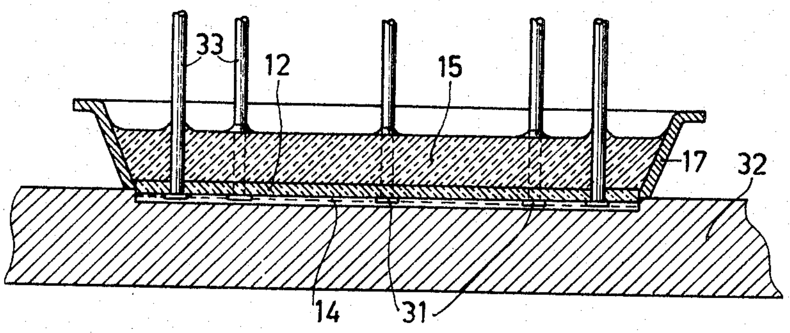

FIGURE 6 shows the manner in which a plurality of conductors 33 provided with heads 31, are passed through the ceramic circuit carrier 12 and then placed on a thin plate 32 of graphite. After provision of the ring 17 the fused glass layer 15 is included so that all the components are interconnected. If thereafter, a coating not shown, is formed by electro deposition on the printed circuit 14 and on the heads 31 of the conductors, satisfactory contact is ensured.

In assembling a structural element or base assembly according to the invention better advantage can be taken of the accuracy of the dimensions of the ceramic carriers to assembly various envelope portions each of which houses one or more circuit carriers.

Figure 7:
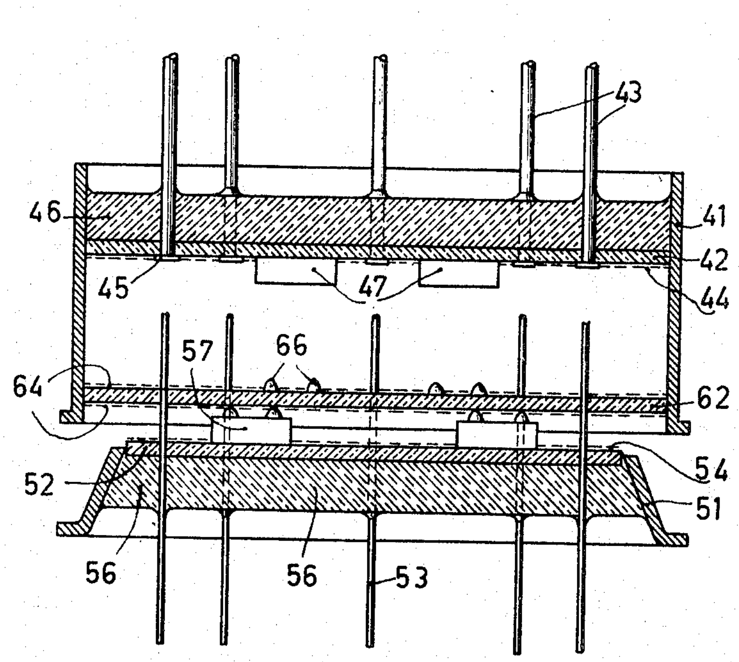
FIGURE 7 is a sectional view of another embodiment of such a structural element.

FIGURE 7 shows, by way of example, envelope portions comprising a comparatively long ring or cylinder 41 having a ceramic carrier 42, provided with a printed circuit 44, a plurality of conductors 43 which are tubular in this case and provided with a collar 45 which bear on the printed circuit and, a glass sealing layer 46 which provides a hermetic seal. A few transistors 47 are shown on the carrier 42 by way of example and a second circuit carrier 62 is also provided in the cylinder.

The other envelope portion comprises a ring 51, a carrier 52, having a printed circuit 54, a glass sealing layer 56 and a few transistors 57. The sealed conductors 53 are thin and can be inserted into the tubular conductor 43. A carrier 62 is slipped on the conductors 53 as shown in FIGURE 5.

The carrier 62 has a printed circuit 64 on each side, one side having contacts 66 which are pushed against the transistors 47. The transistors 57 engage the other circuit 64 on connecting the cylinder 41 and ring 51. The dual use of the circuit carrier 62 naturally imposes strict alignment requirements in view of the height of the various component parts. All the circuit carriers used in the examples are formed as flat discs for the sake of simplicity but the invention, is, of course, not limited thereto. The circuit carriers may alternatively be profiled, for example for matching them to the electric circuit elements to be fixed thereof. Other variations, for example, in the shape of the envelope, the manner of connecting the various portions of the envelope and the shape of the conductors are naturally possible within the scope of the invention.

While I have shown and described the preferred embodiment of my invention, it will be understood that the latter may be embodied otherwise than as herein specifically illustrated or described and that in the illustrated embodiment certain changes in the details of construction and in the arrangement of parts may be made without departing from the underlying idea or principle of the invention within the scope of the appended claims.

What is claimed is:

1. An enclosure assembly comprising: a first printed circuit carrier having a plurality of apertures passing therethrough, a plurality of conductor members passing through said apertures and projecting from at least one side of said first printed circuit carrier, a ring member surrounding said carrier, a glass layer adhered to said carrier and said ring member thereby surrounding said conductors and forming a hermetically sealed base assembly, a second printed circuit carrier in overlying spaced relation to said first record carrier having apertures receiving one or more of said plurality of conductors members, said second printed circuit carrier being supported solely by said plurality of conductor members and the printed circuit of said second printed circuit carrier being in opposed relation to the first printed circuit of said first printed circuit carrier thereby permitting electronic components inserted between said carriers to contact each of said printed circuits, and a housing engaging said ring with said first and second printed circuit carriers located therein.

2. An enclosure assembly according to claim 1 wherein said housing comprises a cylinder, a third printed circuit carrier concentrically within said cylinder adjacent one end thereof, asid third circuit carrier having a plurality of apertures therethrough, a plurality of hollow conductors within said apertures extending outwardly of said cylinder, and a glass layer adhered to one side of said third carrier and said cylinder and surrounding said hollow conductors in hermetic sealed relation; said cylinder concentrically surrounding said first and second carriers with said conductors being telescoped within said hollow conductors, said cylinder abutting said ring and being connected thereto at said abutment.

References Cited

UNITED STATES PATENTS

| | | | |
|---|---|---|---|
| 3,052,822 | 9/1962 | Kilby | 317—101 |
| 3,159,770 | 12/1964 | Longo | 317—101 |

ROBERT K. SCHAEFER, *Primary Examiner.*

J. R. SCOTT, *Assistant Examiner.*